March 10, 1959 C. D. THURMOND 2,877,147

ALLOYED SEMICONDUCTOR CONTACTS

Filed Dec. 1, 1955

INVENTOR
C. D. THURMOND
BY D. H. Wilson, Jr.
ATTORNEY

United States Patent Office
2,877,147
Patented Mar. 10, 1959

2,877,147

ALLOYED SEMICONDUCTOR CONTACTS

Carl D. Thurmond, Stirling, N. J., assignor to Bell Telephone Laboratories, Incorporated, New York, N. Y., a corporation of New York Application December 1, 1955, Serial No. 550,392

8 Claims. (Cl. 148—1.5)

This invention relates to semiconductive translating devices and more particularly to alloyed connections to semiconductive bodies, alloy compositions for such connections, and to methods of forming such connections.

The application is a continuation-in-part of an application Serial No. 388,094, by C. D. Thurmond, filed October 26, 1953, for "Fabrication of Semiconductor P-N Junctions," now United States Patent No. 2,837,448, issued June 3, 1958.

Heretofore, major problems have presented themselves in the formation of alloyed connections to semiconductive bodies. While a large number of desirable characteristics have been obtained from an electrical connection formed by methods involving alloyage of certain electrode materials with a portion of a semicoductive body, alloying and fusion techniques frequently introduce strains in the semiconductor during recrystallization, whereby the electrical and physical characteristics of the connection are affected deleterously. At the same time processing methods of producing, as nearly as possible, a plane surface over a substantial portion of the interface between the semiconductive material and the alloy to which it is bonded have not all been entirely successful. A planar interface has long been sought in the production of alloyed connections, particularly in those connections wherein a p-n junction which corresponds to the shape of the interface and which is formed adjacent thereto is desired. Such a requirement arises, for example, in the fabrication of transistors where two such junctions and a pair of plane parallel interfaces, spaced of the order of one thousandth of an inch apart, are formed by alloying from opposite faces of a semiconductive body.

Prior methods of forming semiconductor alloyed connections either have been restricted to the utilization of a soft, low melting point alloy, or have employed the technique of alloying to a considerable depth from a semiconductor surface. By the latter method one seeks to wipe out the initial irregularities of a non-uniformly wetted semiconductor surface and to achieve some degree of planarity in the alloyed bond. Of necessity with such a connection, strains are induced by differential expansion of the component materials, particularly in the production of large area connections, and the effect is that bonds tend to crack and discontinuities are produced which shorten the lifetime of minority charge carriers and result in an inferior product. With a device fabricated in this manner, an appreciable fraction of injected current will be lost at the side faces of the alloyed region and usually with alloyed connections of this type very extensive etching processes, that are costly and involve complex micromanipulation, are necessary to eliminate this stated defect.

Accordingly, it is an object of the present invention to improve alloyed connections to semiconductive bodies.

Another object is to provide an improved method of making alloyed connections to semiconductive bodies and particularly to enable a high quality planar bond to be formed simply and rapidly.

A further object is to fabricate shallow alloyed regions on semiconductive bodies, which are planar, and either form low resistance ohmic connections or introduce rectifying junctions in the region underlying the alloy.

Still another object of the present invention is to eliminate the necessity of rigorously controlled time dependent heating cycles in the fabrication of a high quality planar bond in an alloyed connection to a semiconductive body.

These and other objects of this invention are attained in accordance with aspects of the invention which are broadly directed to connections and methods of their fabrication which obviate the above and other disadvantages of the prior art. According to one aspect of the invention an additive is incorporated in the material to be alloyed to a semiconductive body which reduces the solubility of the semiconductor of the body in the major alloying constituents of that material. For example, the material to be alloyed with the semiconductive body advantageously can contain, as a minor ingredient, the same basic semiconductor material as the body. Thus the amount of semiconductive material of the body which can be dissolved in the alloy mass when it is fused with the body is reduced. One particularly advantageous alloying composition is a saturated solution of the semiconductive material in the other constituent metal or metals at a preassigned temperature. Simply heating the assembly to that temperature and above initiates the alloying and diffusion process whereby the connection is formed. The quantity of semiconductive material of the body dissolved in the fused mass is directly related to the difference between the alloying temperature and the preassigned temperature and is determined by the difference in the solubility of the semiconductive material in the alloy at the preassigned and alloying temperatures. The inhibiting effect of the solubility reducing additive in the alloy reduces in a controllable manner the depth to which alloying takes place, thus rendering certain the formation of a planar bond with the most ideal physical characteristics.

One feature of the invention resides in adding semiconductive material to a basic alloying agent which is to be fused to a semiconductive body of the added material.

In accordance with another feature of the present invention, an alloy of semiconductive material and a metal which is a solvent for that semiconductive material, which alloy has a composition corresponding to that of a saturated solution of the semiconductor in the metal at a selected temperature, is placed upon the surface of a body which has essentially the same composition as the dissolved semiconductor and the assembly is raised to an alloying temperature somewhat exceeding the selected temperature. This produces an alloyed region of limited penetration which has an interface with a semiconductive body which substantially corresponds to the original contour of the body surface.

In accordance with another feature of the present invention, additives are initially combined with a mixture of semiconductive material and a basic alloying agent, forming an alloy element from which is fashioned an alloyed connection to a semiconductive body, thus tailoring the electrical and mechanical qualities of the connection and the semiconductive material adjacent thereto to desired characteristics whereby an ohmic connection is formed or one or more planar rectifying junctions are introduced in the adjacent semiconductive body.

In accordance with a further feature of the invention, an alloy element comprising semiconductive material and a metal which is a solvent for this material is provided upon a body of corresponding semiconductive material and the assembly is first heated above the eutectic temperature of the semiconductor and solvent metal. Following this heating, the temperature is reduced to just somewhat above the eutectic temperature of the semiconductor and solvent metal, and a molten mass of a metal having a melting point such that upon cooling of the assembly it is the last constituent to remain in a molten state, is introduced over the semiconductor-alloy element mass. After this, the assembly is cooled and during the cooling, in effect, a substantial portion of the molten semiconductor-alloy element, first floats on the added molten metal and then solidifies, forming between the metal and the unfused portion of the semiconductive body a semiconductor zone which exhibits electrical characteristics determined by the type of conduction carrier centers of the solvent metal employed in the alloy element.

The novel features which are believed to be characteristic of the invention, both as to its organization and method of operation, together with further objects and advantages thereof, will be understood more clearly and fully from the following description considered in connection with the accompanying drawing, in which.

Figure 1:
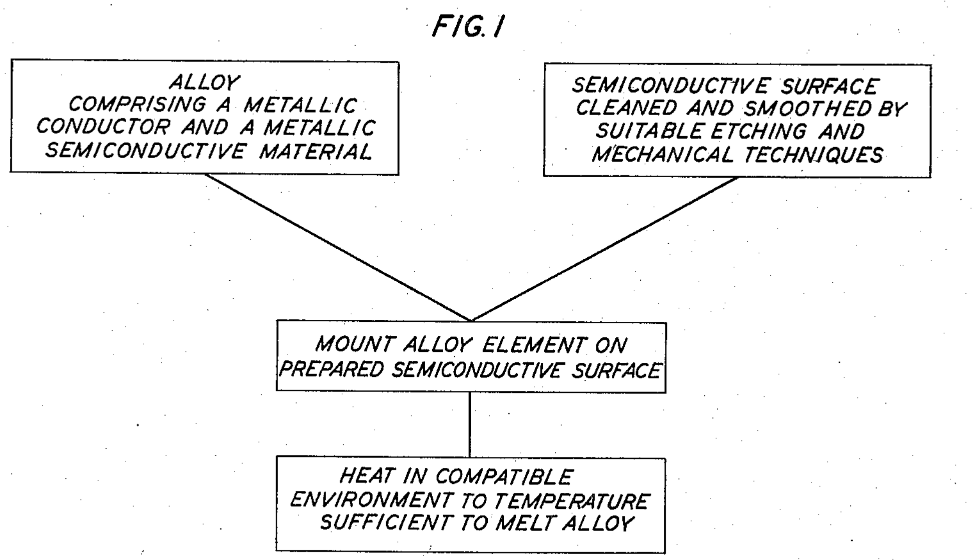
Fig. 1 is a diagrammatical representation of a flow sheet illustrating how the invention may be practiced.

Referring to the drawing in detail, and first considering Fig. 1, it will be seen that an alloyed connection is formed on a semiconductive body which, for example, may be a thin wafer, by placing on the surface of the wafer, a mass of an alloy containing semiconductive material corresponding to the material of the wafer, and heating the assembly in a compatible environment such as a reducing or inert atmosphere to a temperature at which the alloy and the wafer material fuse. In some instances it is advantageous to insure that during a portion of the alloying interval the molten alloy contains less than a saturated concentration of the wafer material. That a mass of an alloy according to this invention contains semiconductive material corresponding to the material of the wafer means that the major portion of the semiconductive material of the alloy mass and of the wafer chemically correspond. For example, the alloy mass should preferably contain silicon when the wafer to which it is to be attached is silicon, and a germanium containing alloy is preferred for attachment to a germanium wafer. In all cases, minor and predominant conductivity type determining substances, such as acceptors and donors, which constitute only a small percentage of a semiconductive material may differ chemically in the two forms of semiconductive material involved in this process.

Since differing coefficients of expansion of the various materials is the principal source of stresses which induce detrimental strains in alloyed connections, and it is desirable that a material which has characteristics which will alleviate the result attendant such difference in expansion coefficients be incorporated into the alloyed connection, semiconductor material which is mutually related or similar in composition, i. e., the major portion being chemically identical, to the material of the semiconductive body to which the alloyed connection is to be made, advantageously may be employed. This process is applicable to those semiconductors commonly considered to be metalloids, to boron, selenium, germanium, silicon, tellurium, an alloy comprising some of these elements, or to an intermetallic compound of the group 3-group 5 type. For the purposes of illustration, the following discussion will be directed to the alloying of metal to silicon.

The production of alloyed electrical connections to semiconductive bodies is governed by factors which include the solubility of the semiconductive material in the major constituent of the alloy. As it is desirable to obtain a planar junction or a planar bond, it is advantageous to keep the alloying depth low, and this requirement necessitates a low solubility of semiconductor in the metal or metallic system attached by alloyage to the body of semiconductive material. Although diffusion processes must be recognized as playing a part at an alloy-semiconductor interface, the overall process is termed "alloying" since an alloyed connection to a semiconductor body involves the fusing of at least a portion of both the metal and the body. The wetting of the semiconductor by the solvent metal must also be taken into account as an important factor which governs the formation of alloyed connections. Wetting is dependent on the surface tension of the molten alloy mass element and participates in determining the shape of the periphery of the alloyed region on the semiconductor body. Solubility determines the penetration depth, so likewise has an effect on the metal-semiconductor interface shape. In order to obtain a uniform penetration of the alloy front over the entire surface embraced by the periphery of the alloyed connection, the wetting process must take place as uniformly and therefore as rapidly as possible. Further this wetting should occur at a temperature at which the solubility of semiconductor in the alloy mass is small, i. e., at a low temperature. Because the wetting is accelerated by a low surface tension, and surface tension is an inverse function of temperature, it is desirable to process at as high a temperature as is possible. This paradox can be avoided according to this invention and alloyed connections can be formed over a very wide range of temperatures, without the resultant deep alloy penetration due to increasing solubility of semiconductor with temperature, since the alloy mass element initially contains semiconductor material and dissolution of more of this material from the semiconductor body itself is greatly retarded.

Advantageously, the composition of the alloy employed in the fabrication of alloyed connections may correspond to that of a saturated solution of semiconductive material in the solvent metal at a preassigned temperature. This can be a temperature where excellent wetting will be expected. When a mass of such an alloy is placed upon the surface of the semiconductive body and the assembly heated to that temperature, the alloying process is initiated. However, the fusion process is inhibited and easily controlled since the alloy mass which is being attached to the semi-conductive body is already saturated with semiconductive material and diffusion of this material from the semiconductive body into the alloyed region is greatly retarded, resulting in the formation of an alloyed connection with low penetration depth and a substantially planar interface with the semiconductive body. Advantageously the interfacial region between the semiconductive body and the alloy mass may be heated at a rate which insures that the dissolved semiconductive material of the mass goes steadily into solution, so that at all temperatures below the preassigned one the alloy mass will be essentially saturated with the semiconductive material which has been incorporated in it. With a fast flash heating, for example at a heating rate of 1000° centigrade per hour, some of the advantage of this process might be lost since dissolution of semiconductive material within the alloy mass might not at times keep pace with the advancing temperature and some slight uncontrolled penetration of the surface of the semiconductive body by the alloy mass might result during short periods of unsaturation within that mass. In this process heating rates of 200° centigrade per hour and below have been employed to excellent advantage. The particular heating rate chosen will depend to some extent on the particular alloy system involved and hence also upon the alloying temperature assigned but at any heating rate the penetration depth of the alloy mass into the semiconductive body has been substantially lower and the alloyed connection therefore substantially more planar than that obtainable without the inclusion of semiconductive material in the alloy mass as in accordance with this invention. To further assure that dissolved semiconductive material of the mass goes into solution during heating at a rate which maintains the alloy mass saturated at all times with that semiconductive materal, an alloy mass can be prepared in which the semiconductive constituent exists as a finely subdivided material with great surface area. With such alloy contact elements, prepared in this manner, for example, by quenching the alloy when molten to nucleate finely divided crystals, greater heating rates are entirely suitable for formation of planar alloyed connections according to this process.

This alloying process is employed in forming electrical contacts to semiconductive bodies. The electrical characteristics of these contacts are generally ohmic and of low resistance. They can be made to engage semiconductive material of the same conductivity type as that of the original body or of the opposite conductivity type engaging body portions of the original conductivity type at a rectifying barrier of the n-p junction type. As in the prior art the nature of the semiconductive material underlying a frozen alloy mass can be influenced by the introduction from the alloy into that material of conductivity type determining substances either by the process of mixing in the semiconductor when it is melted by the alloying process or by diffusion in the solid at the alloying temperatures. Thus n-type conduction characteristics can be introduced or enhanced in the underlying semiconductor by including a donor substance in the alloy mass; for example, phosphorous, arsenic, antimony and bismuth in germanium, silicon and silicon-germanium alloys. Similarly p-type conduction characteristics are realized in the semiconductor adjacent the alloy by including an acceptor substance in the alloy mass. Boron, aluminum, gallium and indium are typical acceptor substances for germanium, silicon and silicon-germanium alloy semiconductors. In practice the conductivity type determining substance is usually a component of an alloy which has the ability to dissolve some semiconductive material at a temperature below 850° centigrade and, on cooling, permits the semiconductive material to precipitate at the metal-semiconductor interface to form a recrystallized layer having a conductivity type characteristic of the substance. Thus, for example, a junction type rectifier can be formed by alloying to a semiconductive body of one conductivity type one alloy mass containing a substance characteristic of that conductivity type to form an ohmic connection to the major body portion and a second alloy mass containing a substance characteristic of the opposite conductivity type to form a region in the body of that opposite conductivity type and a rectifying n-p junction between that region and the major body portion.

Figure 2:
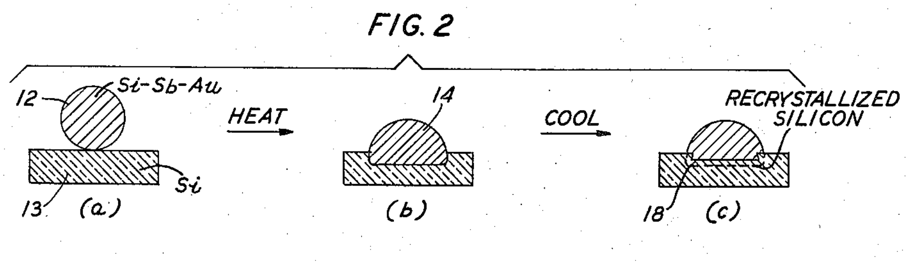
Fig. 2 is a diagram depicting the fabrication of an alloyed connection to a semiconductive body in accordance with one aspect of this invention and illustrative of one specific embodiment of the invention.

As shown in Figs. 1 and 2, an alloyed connection can be formed by mounting a mass 12 of a suitable alloying composition, for example, of silicon, antimony, and gold, against the surface of a semiconductive wafer 13, for example, of silicon, and preferably one that has been cleaned by conventional etching techniques to facilitate wetting of the semiconductor by the molten alloy. The combination, at least in the vicinity of the interface between the elements, is heated, for example, in a helium atmosphere to fuse the elements and to cause the semiconductor to enter into solution with the alloying agents. During the heating, atoms of semiconductive material from the wafer tend to enter the molten alloying constituents at a rate which depends upon the concentration gradient and diffusion rate of the semiconductor material therein in the region adjacent the interface. The concentration of semiconductive material in the region adjacent this interface is the saturation concentration for the temperature of the interface, and the dissolution proceeds as long as the concentration of semiconductor material in the body of the melt is less than that in the region of the interface. Since, according to this invention, the alloy mass initially contains dissolved semiconductor material, dissolution of the wafer material is inhibited and a saturation concentration of semiconductor in the alloy region near the interface is achieved relatively quickly while yet the depth of alloy penetration into the semiconductive wafer is low. If the alloy mass element has been presaturated with semiconductive material at a preassigned temperature suitable for alloying, substantially none of the semiconductive body will dissolve into the alloy mass below that temperature. Raising the temperature slightly alters the diffusion processes, essentially in equilibrium at the saturation concentration, and a small amount of the semiconductor body dissolves in the alloy mass. Since a high initial saturation concentration and thus a high temperature for initial dissolution can be chosen, rapid wetting over the alloy semiconductor interface without the usual rapid alloy penetration, can be achieved so that a greater uniformity of solution of the face of the initial body obtains and greater planarity of the p-n junction produced is realized.

After alloying to the desired depth, as shown in Fig. 2*b*, the molten material 14 is solidified. As cooling proceeds, the concentration of semiconductor material in the molten solution exceeds saturation and semiconductive material precipitates from the supersaturated solution onto the base provided by the solid semiconductive body. This precipitation forms in regular crystalline form, as represented by region 18 in Figs. 2*c* and 3, and is of the same orientation as the base material. In the molten mass it nucleates into crystallites 17 which may be dispersed at random throughout that mass as it freezes. In some cases, due to the variant densities of the materials involved, the crystallites may float to the top of the mass before freezing takes place.

The most extensively used alloying metals for silicon have been aluminum and gold. Excellent results have been obtained using these two elements and others in accordance with this invention to fabricate alloyed connections to semiconductive bodies. For example, rectifying n-p junction have been found in n-type silicon bodies in the vicinity of alloy connections derived from masses of aluminum alloys containing up to 30 atomic percent silicon. Similarly such alloy masses can be employed to form ohmic contacts to p-type silicon. According to this invention, other solvents suitable for alloy connections to silicon include tin, zinc, indium and gallium. Thallium, zinc, tin, lead, indium and gallium are examples of solvents suitable for alloy connections to germanium. Gold gives a eutectic with silicon at about 370° centigrade and when containing up to 40 atomic percent of silicon, can be employed for alloyed ohmic connections for p-type silicon alloyed diodes.

Where a rectifying barrier in p-type silicon is desired 0.5–10 percent antimony can be added to the gold-silicon alloy mass. Rectifying n-p junction adjacent alloyed connections to p-type silicon can be formed by placing a freshly etched silicon wafer 13 in a suitable jig (not shown) and introducing a freshly etched gold-silicon-antimony bead 12 which is held against the silicon surface. An example of a composition for alloy beads from which successful alloyed connections have been made to p-type silicon bodies is an alloy containing by weight 3 percent silicon, 9 percent antimony and 88 percent gold. Advantageously the alloy bead may be held against the silicon with either tungsten wire or a carbon rod (not shown). A pressure contact between the alloy and the silicon in most cases allows the alloying to occur at a temperature approximately between 650°–750° centigrade, which is significantly lower than without applied pressure. In general alloying is effected by heating the gold, silicon and antimony to a temperature from between about 550° centigrade and about 850° centigrade. The lower limit is based upon a minimum for practical alloying of the constituents, and the upper limit upon difficulties of conserving sufficient diffusion length of holes and electrons in silicon near the junction after alloying at temperatures in excess of 850° centigrade.

Figure 3:
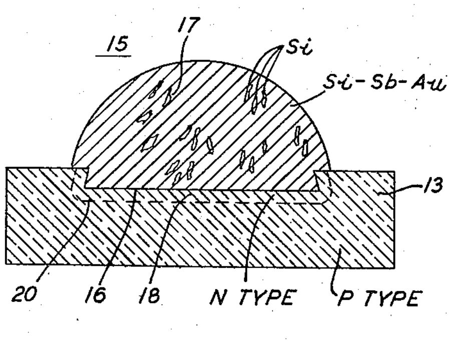
Fig. 3 is an enlarged sectioned elevation of a connection of the type formed in accordance with one embodiment of this invention.

Fig. 3 shows an n-p junction and an alloyed connection formed in accordance with this invention on a p-type semiconductive body 13 which may be of some material such as boron, selenium, germanium, silicon, tellurium, an alloy comprising some of these elements, or an intermetallic compound of the group 3-group 5 type. For the purpose of illustration in the following discussion the semiconductive body 13 will be considered to be silicon. The alloyed mass 15 engaging the semiconductive body at an interface 16 consists of a dispersion of semiconductive crystallites 17 in a body of gold, silicon and antimony. Adjacent to the interface, between the mass 15 and the body 13, is a region of recrystallized semiconductive material 18 which, when the alloying material is of an acceptor type, is p-type material having the same crystal orientation as the portion of the semiconductive body which remains solid throughout the alloying process and provides a base or matrix therefor. Thus, when the semiconductive body is p-type material, for example, p-type silicon, and the alloying material is a gold-silicon-antimony composition, the recrystallized region 18 is of n-type silicon, and an n-p junction 20 is formed intermediate the material in the vicinity of the alloy mass and the remainder of the body. On the other hand, when the semiconductor is of n-type material and the gold-silicon-antimony alloying composition is alloyed thereto, the recrystallized material is high conductivity n-type and the strain-free connection thus formed has low resistance ohmic characteristics.

Figure 4:
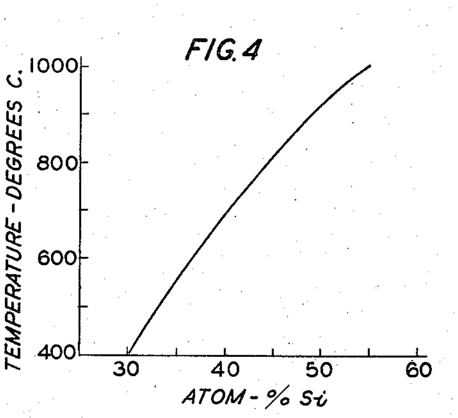
Fig. 4 is a temperature-solubility curve for silicon in gold.

Examples of alloy compositions comprising saturated solutions of the semiconductive material in the major constituent of the alloy mass are apparent from the consideration of a temperature-solubility curve for any particular constituents. For example, the solubility of silicon in gold at temperatures in the range from 400 to 1000 degrees centigrade is set forth graphically in Fig. 4, and it is seen that at 700° centigrade gold will dissolve approximately 40 atomic percent silicon and that an alloy mass which is 60 atomic percent gold and 40 atomic percent silicon is saturated with respect to silicon concentration at that temperature. According to this invention when such an alloy mass is placed upon the surface of a silicon body and the assembly heated to the preassigned temperature of 700° centigrade and above, the alloying and diffusion process is initiated. Since the quantity of silicon of the body which dissolves in the fused mass is directly related to the difference between the alloying temperature and the preassigned temperature, the inhibiting effect of the solubility reducing additive in the alloy reduces in a controllable manner the depth to which alloying takes place. Thus in this process it is not the time of alloying but the difference in the solubility of silicon in the alloy at the preassigned and at the alloying temperatures that is important. An increase in the temperature of the assembly to about 710 or 715 degrees centigrade is sufficient to form a strong but shallow connection and render certain the formation of a planar bond. One advantage to be realized from the utilization of this invention is derived by simply heating the assembly to just below the preassigned temperature and then cooling the molten material. Since by this method wetting is achieved although essentially no solution of semiconductive body material takes place, it is possible to grow back a regrowth layer of semiconductive material and form a planar junction right in the vicinity corresponding to the position of the original body surface. By such a process, for example, a p-n-p alloyed junction device may be fabricated where the thickness of the n-layer is accurately defined by the thickness of the original n-type semiconductive slice to which alloyed connections were made. Another advantage is derived from employing the eutectic composition of the major alloying constituent and the semiconductor as the alloying agent. With many combinations this composition becomes molten at a lower temperature than any other, thereby enabling alloyed contacts to be quickly formed without processing at high temperatures. One example of such an alloy composition suitable for germanium devices is the gold-germanium eutectic of 73 atomic percent gold and 27 atomic percent germanium which is molten at 356° centigrade.

The invention may be utilized also with materials other than those noted in the specific cases above described, to realize the advantages of particular efficacy of certain impurities in effecting inversion of conductivity type of the semiconductor, without production of degrading strains in the product. For example, major alloy constituents which themselves have an electrical effect include gallium, indium, antimony and bismuth, whereas the employment of tin, thallium, lead and cadmium as major alloy constituents is usually for reasons of their mechanical characteristics, more than for the electrical effect that these metals impart to the alloyed connections.

In the case of a metallic system such as aluminum, indium and silicon, some physical incompatability of indium and aluminum in the molten phase makes it advantageous to add the indium to the aluminum-silicon phase according to the process disclosed in the above-identified parent application. In that application, where strain in alloyed connections is to be avoided, an alternative means of alloying is presented wherein at a temperature somewhat above the eutectic temperature of the semiconductor and metal of the initial alloy, a molten mass of a metal having a melting point substantially lower than that of the major alloy constituent is introduced over the semiconductor-alloy mass. For example, an alloy of aluminum and silicon may be used, the alloy having a composition corresponding to that of a selected temperature on a temperature-solubility curve (not shown) for silicon in aluminum. The silicon body with the silicon-aluminum alloy thereon is heated slowly to this temperature. As the aluminum is substantially saturated with silicon, very little of the silicon body will dissolve. The temperature is then increased whereby a portion of the body enters into the solution. Following this the temperature is lowered, indium is introduced over the semiconductor-alloy mass, and the assembly cooled. Indium has a lower melting point (155° centigrade) than aluminum and is relatively soft. When, in the process, the indium is added to the molten aluminum-semiconductor phase, the aluminum-semiconductor phase floats to the top and upon solidification of the composite, the indium-rich phase separates the aluminum-rich phase from the semiconductive body. The junction is of uniform electrical and physical characteristics and large area, substantially planar junctions can be formed free of deleterious strains.

It is to be understood that the above-described arrangements and techniques are but illustrative of the application of the principles of the invention. Numerous other arrangements and procedures may be devised by those skilled in the art without departing from the spirit and scope of the invention.

What is claimed is:

1. The method of producing a substantially planar alloy connection to a portion of a body consisting essentially of crystalline semiconductive material which comprises the steps of placing upon said portion an alloy mass comprising an additional amount of said semiconductive material and a metal which is a solvent therefor, said alloy mass having a melting point below that of said semiconductive material and having a composition such that the liquid phase at its melting point is saturated with respect to said semiconductive material, heating the interfacial region between said portion and said alloy mass to a temperature above the melting point of said alloy mass and below the melting point of said semiconductive material, and cooling the assembly to room temperature.

2. The method of claim 1 in which said semiconductive material is germanium.

3. The method of claim 1 in which said semiconductive material is silicon.

4. The method of claim 1 in which said alloy mass consists essentially of said semiconductive material, a metal which is a solvent for said semiconductive material, and a conductivity-type determining material.

5. The method of claim 3 in which said portion is of p-type conductivity, said metal is gold, and said conductivity-type determining material is antimony.

6. The method of claim 1 in which said alloy mass consists essentially of said semiconductive material and a metal solvent therefor which is a conductivity-type determining material.

7. The method of claim 6 in which said semiconductive material is silicon, said portion is of n-type conductivity, and said metal is aluminum.

8. The method of claim 6 in which subsequent to the said step of heating the interfacial region and prior to the said step of cooling the assembly to room temperature the said interfacial region is cooled to a second temperature above the eutectic temperature of said semiconductive material and said metal, and the assembly is covered with a molten metal having a melting point below that of said metal.

References Cited in the file of this patent

UNITED STATES PATENTS

| | | |
|---|---|---|
| 2,629,672 | Sparks | Feb. 24, 1953 |
| 2,736,847 | Barnes | Feb. 28, 1956 |
| 2,742,383 | Barnes et al. | Apr. 17, 1956 |
| 2,757,324 | Pearson | July 31, 1956 |
| 2,762,730 | Alexander | Sept. 11, 1956 |

FOREIGN PATENTS

| | | |
|---|---|---|
| 1,088,371 | France | Sept. 8, 1954 |